(12) United States Patent
Lih et al.

(10) Patent No.: US 10,613,150 B2
(45) Date of Patent: Apr. 7, 2020

(54) BATTERY HEALTH STATE EVALUATION DEVICE AND METHOD

(71) Applicant: NATIONAL CHUNG SHAN INSTITUTE OF SCIENCE AND TECHNOLOGY, Taoyuan (TW)

(72) Inventors: Wen-Chen Lih, Taoyuan (TW); Hung-Jhih Ku, Yuanli Township (TW); Bo-Lin Liao, Erlun Township (TW); Tsung-Yu Tsai, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 274 days.

(21) Appl. No.: 15/834,703

(22) Filed: Dec. 7, 2017

(65) Prior Publication Data
US 2019/0178943 A1    Jun. 13, 2019

(51) Int. Cl.
*G01R 31/3842* (2019.01)
*G01R 31/36* (2020.01)
*G01R 31/392* (2019.01)
*G01R 31/374* (2019.01)
*G01R 31/389* (2019.01)

(52) U.S. Cl.
CPC ..... *G01R 31/3842* (2019.01); *G01R 31/3648* (2013.01); *G01R 31/392* (2019.01); *G01R 31/374* (2019.01); *G01R 31/389* (2019.01)

(58) Field of Classification Search
CPC .............. G01R 31/3842; G01R 31/392; G01R 31/3648; G01R 31/389; G01R 31/374
USPC .......................................................... 324/430
See application file for complete search history.

(56) References Cited

U.S. PATENT DOCUMENTS

| | | | |
|---|---|---|---|
| 8,159,228 B2* | 4/2012 | Ferre | G01R 31/389 324/430 |
| 10,193,366 B2* | 1/2019 | Josephs | H02J 7/0021 |
| 2002/0109506 A1* | 8/2002 | Kawakami | G01R 31/389 324/522 |
| 2012/0126819 A1* | 5/2012 | Liu | G01R 31/389 324/427 |
| 2017/0117725 A1* | 4/2017 | Hendricks | H01M 10/486 |
| 2019/0190303 A1* | 6/2019 | Geng | H01M 10/48 |

* cited by examiner

*Primary Examiner* — Melissa J Koval
*Assistant Examiner* — Rahul Maini
(74) *Attorney, Agent, or Firm* — Schmeiser, Olsen & Watts, LLP

(57) ABSTRACT

A battery health state evaluation method for evaluating a health state of a battery comprises a charging step, an idling step, a pulse discharging step, an evaluation index calculating step, and an evaluation result yielding step. The evaluation index calculating step retrieves a continuous voltage data and a continuous current data in a charging process, an idling process, and a pulse discharge process and calculates a plurality of evaluation indexed according to the continuous voltage data and continuous current data. The evaluation indexes are associated with the health state of the battery. The evaluation result yielding step evaluates the health state of the battery according to the indexes and yields an evaluation result. Therefore, the battery health state evaluation method is easy, convenient, and effective in performing a test quickly and accurately.

9 Claims, 17 Drawing Sheets

|      | R1    | R2    | R3    |
|------|-------|-------|-------|
| 100% | 0.017 | 0.016 | 0.015 |
| 85%  | 0.027 | 0.026 | 0.025 |
| 45%  | 0.050 | 0.049 | 0.048 |
| 15%  | 0.057 | 0.056 | 0.055 |

FIG. 5

BATTERY HEALTH STATE EVALUATION DEVICE AND METHOD

FIELD OF THE INVENTION

The present invention relates to battery health state evaluation devices and methods and, more particularly, to a battery health state evaluation device and method effective in obtaining a diagnosis result quickly.

BACKGROUND OF THE INVENTION

Conventional definitions of a battery present health state are based on evaluation of the remaining available capacity and the impedance level during DC discharge. However, the DC discharge impedance level of a battery is never fixed, because it depends on the operating condition, ambient temperature, remaining power level, and deterioration status of the battery. Furthermore, the remaining available capacity depends on charge/discharge current magnification, discharge depth, and ambient temperature.

In view of this, diagnosis of the present health state of a battery must be carried out by a dynamic, integrated evaluation process in order to interpret the present health state of the battery correctly.

SUMMARY OF THE INVENTION

It is an objective of the present invention to provide a battery health state evaluation device which is easy, convenient, and effective in performing a test quickly and accurately.

In order to achieve the above and other objectives, the present invention provides a battery health state evaluation device for evaluating a health state of a battery. The battery health state evaluation device comprises a battery data retrieving module, an evaluation index calculating module, and an evaluation result yielding module.

The battery data retrieving module is connected to the battery through a connection line to retrieve a continuous voltage data and a continuous current data while the battery is discharging. The evaluation index calculating module calculates at least one evaluation index in accordance with the continuous voltage data and the continuous current data. The evaluation result yielding module compares the at least one evaluation index with stored past data to yield at least one evaluation result of the health state of the battery.

In an embodiment of the battery health state evaluation device of the present invention, the evaluation index calculating module comprises a peak level indicating unit for indicating three peak voltage levels in the continuous voltage data and indicating three peak current levels in the continuous current data.

In an embodiment of the battery health state evaluation device of the present invention, the evaluation index calculating module further comprises an impedance level calculating unit for calculating three peak resistance levels in accordance with the peak voltage levels and the peak current levels.

In an embodiment of the battery health state evaluation device of the present invention, the past data comprises experimental data about batteries with different health states.

In an embodiment of the battery health state evaluation device of the present invention, the past data comprises experimental data about batteries with the same health state at different ambient temperatures.

The battery health state evaluation device in an embodiment of the present invention further comprises a programmable loader for starting the battery.

In an embodiment of the battery health state evaluation device of the present invention, the evaluation result comprises a remaining capacity level, a failure risk level, and a remaining lifespan level.

Therefore, the battery health state evaluation device of the present invention uses the evaluation index calculating module to obtain one or more evaluation indexes associated with the battery's health state, and uses the evaluation result yielding module to obtain an evaluation result of the battery's health state.

It is an objective of the present invention to provide a battery health state evaluation method which is easy, convenient, and effective in performing a test quickly and accurately.

In order to achieve the above and other objectives, the present invention further provides a battery health state evaluation method for evaluating a health state of a battery. The battery health state evaluation method comprises a charging step, an idling step, a pulse discharging step, an evaluation index calculating step, and an evaluation result yielding step.

The charging step involves charging the battery with a fixed current. The idling step involves stopping the charging of the battery but idling the battery. The pulse discharging step involves starting the battery to cause the battery to undergo pulse discharge thrice consecutively. The evaluation index calculating step involves retrieving a continuous voltage data and a continuous current data in the charging process, the idling process, and the pulse discharge process and applying the retrieved continuous voltage data and continuous current data to calculation of a plurality of evaluation indexes associated with the health state of the battery. The evaluation result yielding step involves evaluating the health state of the battery with the indexes and yielding an evaluation result.

In an embodiment of the battery health state evaluation method of the present invention, the charging step lasts for a first time period, and the idling step lasts for a second time period.

In an embodiment of the battery health state evaluation method of the present invention, the evaluation indexes comprise a remaining capacity prediction index, a maximum charge temperature variation rate index, a maximum charge voltage variation rate index, a maximum voltage recovery variation rate index, a maximum discharge current level index, a maximum discharge impedance level index, and a pulse discharge impedance level convergence tendency index.

In an embodiment of the battery health state evaluation method of the present invention, in the pulse discharging step, the peak current level of the second instance pulse discharge is 90% the peak current level of a first instance pulse discharge, and the peak current level of a third instance pulse discharge is 80% the peak current level of the first instance pulse discharge.

In an embodiment of the battery health state evaluation method of the present invention, the pulse discharging step lasts for less than one second.

In an embodiment of the battery health state evaluation method of the present invention, the evaluation result comprises a remaining capacity level, and the evaluation indexes comprise a remaining capacity prediction index.

In an embodiment of the battery health state evaluation method of the present invention, the evaluation result comprises a failure risk level, and the evaluation indexes comprise a maximum charge temperature variation rate index, a maximum discharge current level index, a maximum discharge impedance level index, and a pulse discharge impedance level convergence tendency index.

In an embodiment of the battery health state evaluation method of the present invention, the evaluation result comprises a remaining lifespan level, and the evaluation indexes comprise a remaining capacity prediction index, a maximum charge voltage variation rate index, a maximum voltage recovery variation rate index, and a pulse discharge impedance level convergence tendency index.

In an embodiment of the battery health state evaluation method of the present invention, the evaluation result yielding step further comprises a temperature compensation step for performing numerical correction on the evaluation indexes and a sensed ambient temperature in accordance with past data.

Therefore, the present invention battery health state evaluation method comprises the evaluation index calculating step for obtaining one or more evaluation indexes associated with the battery's health state, and the evaluation result yielding step for obtaining an evaluation result of the battery's health state.

BRIEF DESCRIPTION OF THE DRAWINGS

Objectives, features, and advantages of the present invention are hereunder illustrated with specific embodiments in conjunction with the accompanying drawings, in which:

FIG. 5 is a table of past data;

DETAILED DESCRIPTION OF THE PREFERRED EMBODIMENTS

Figure 1:
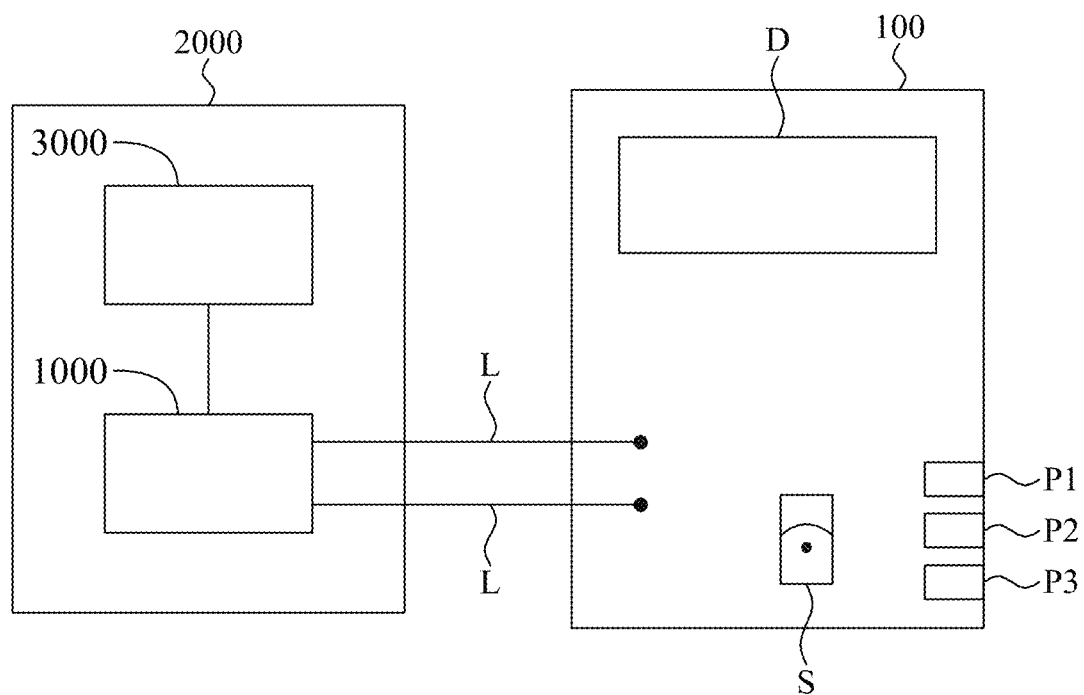
FIG. 1 is a schematic view of a battery health state evaluation device connected to a battery according to the present invention.
Figure 2:
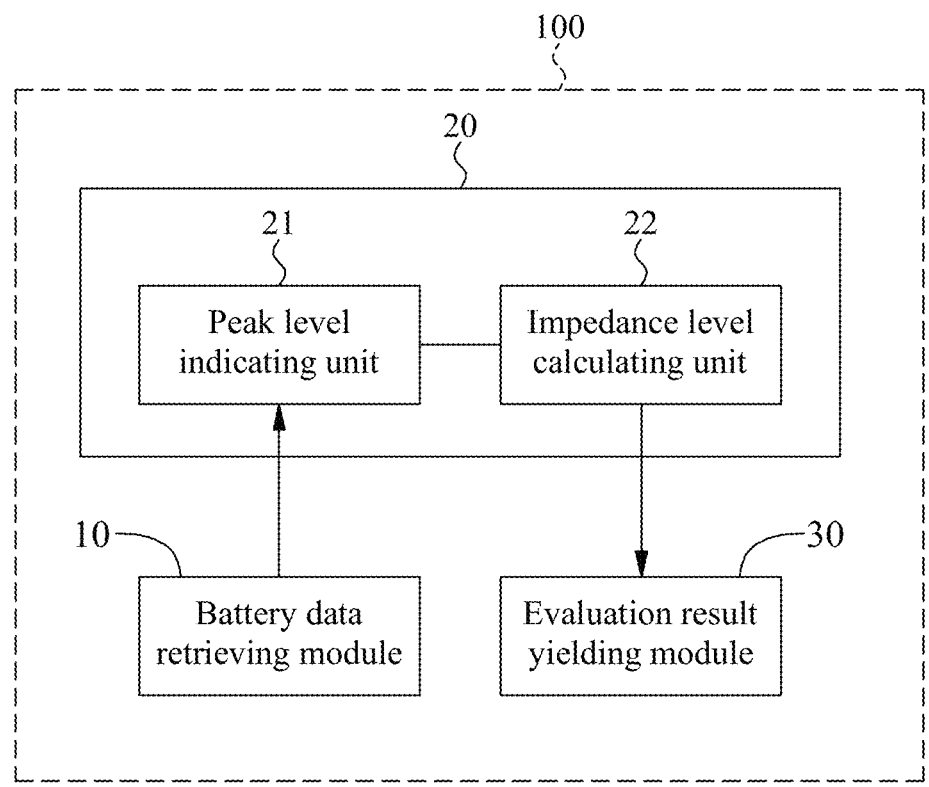
FIG. 2 is a block diagram of an internal circuit of the battery health state evaluation device according to the present invention.

Referring to FIG. 1 and FIG. 2, a battery health state evaluation device 100 of the present invention is described below. FIG. 1 is a schematic view of the battery health state evaluation device 100 connected to a battery 1000 according to the present invention. The battery 1000 is disposed in a battery chamber of an object 2000 (such as a vehicle). The object 2000 has an engine 3000 or any other apparatus for starting the battery 1000. FIG. 2 is a block diagram of an internal circuit of the battery health state evaluation device 100 and shows that the battery health state evaluation device 100 comprises a connection line L, a switch S, a display D, and a plurality of ports P1-P3. The battery health state evaluation device 100 comprises therein a battery data retrieving module 10, an evaluation index calculating module 20, and an evaluation result yielding module 30.

The connection line L is connected to the battery health state evaluation device 100 and the battery 1000. The switch S determines whether to turn on or turn off the battery health state evaluation device 100. The display D displays an operating interface, one or more of a plurality of evaluation indexes, and an evaluation result. The ports P1-P3 connect the battery health state evaluation device 100 to the other external components. The number of the ports P1-P3 is not necessarily three. In a variant embodiment, the ports P1-P3 are provided in the form of USB and SD cards.

Figure 3:
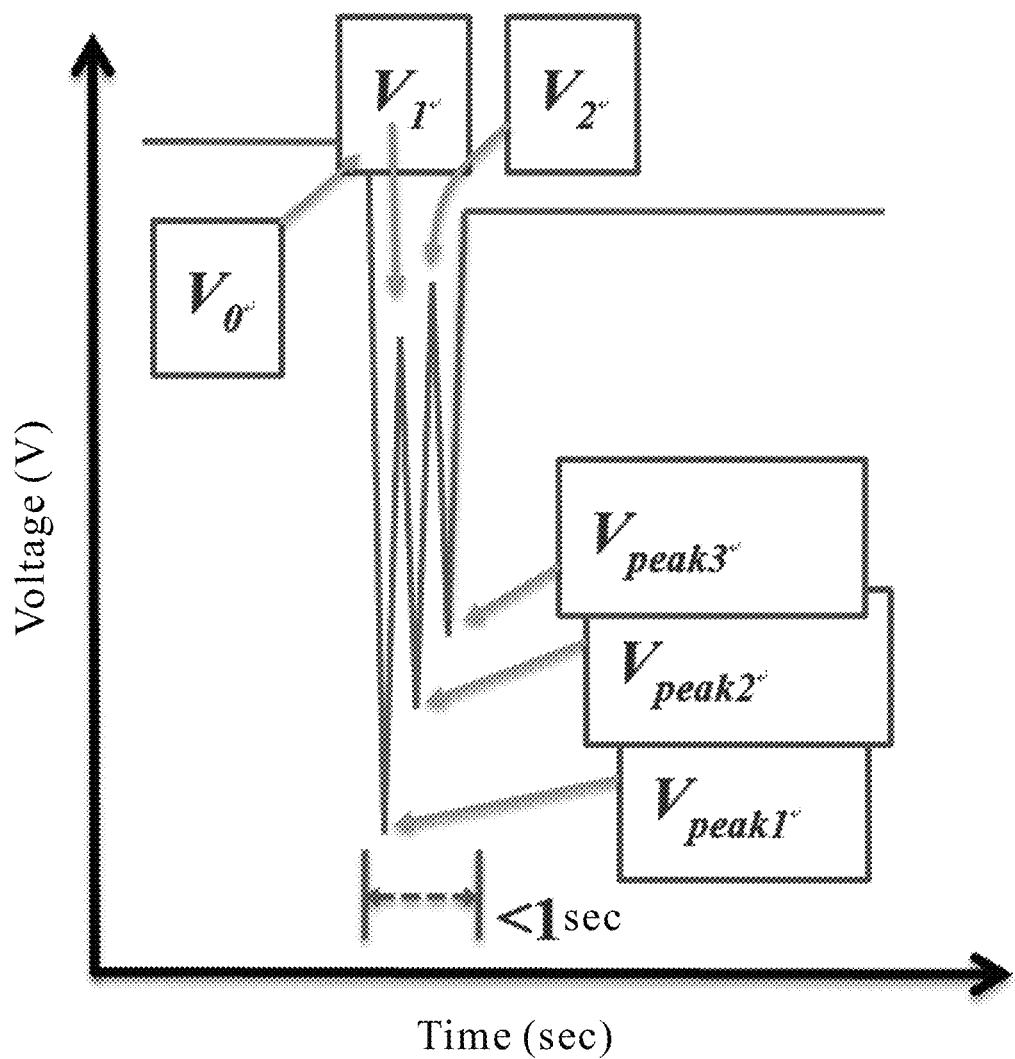
FIG. 3 is a graph of voltage against time with reference to a possible aspect of a continuous voltage data according to the present invention.

The battery data retrieving module 10 is connected to the battery 1000 through the connection line L to retrieve a continuous voltage data D1 and a continuous current data D2 while the battery 1000 is discharging. A possible aspect of the continuous voltage data D1 is shown in FIG. 3. A possible aspect of the continuous voltage data D2 is shown in FIG. 4.

Referring to FIG. 3, voltage $V_0$ denotes the initial voltage level before the first instance discharge of the battery 1000, voltage $V_1$ denotes the initial voltage level before the second instance discharge of the battery 1000, voltage $V_2$ denotes the initial voltage level before the third instance discharge of the battery 1000, voltage $V_{peak1}$ denotes the peak voltage level of the first instance discharge of the battery 1000, voltage $V_{peak2}$ denotes the peak voltage level of the second instance discharge of the battery 1000, and voltage $V_{peak3}$ denotes the peak voltage level of the third instance discharge of the battery 1000.

Figure 4:
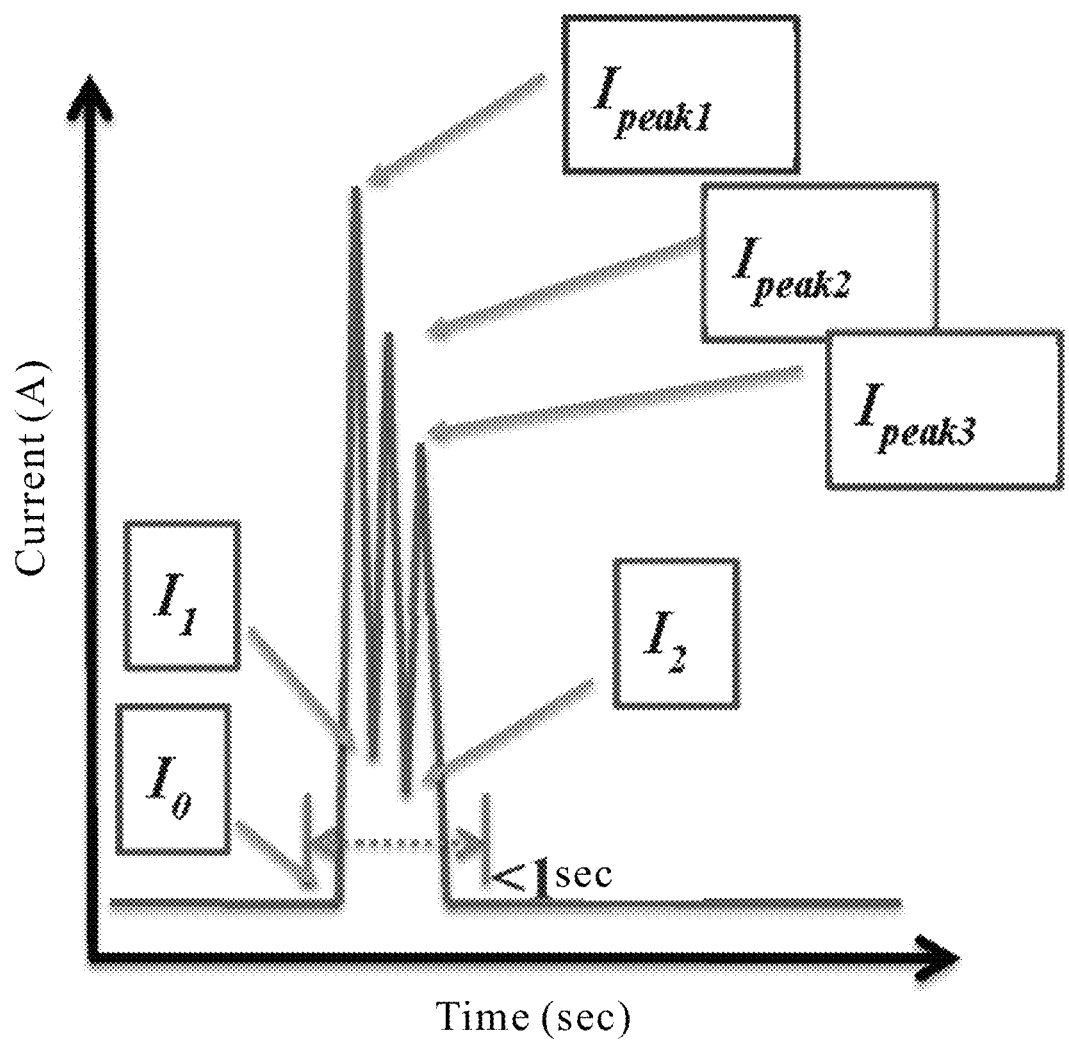
FIG. 4 is a graph of current against time with reference to a possible aspect of a continuous current data according to the present invention.

Referring to FIG. 4, current $I_0$ denotes the initial current level before the first instance discharge of the battery 1000, current $I_1$ denotes the initial current level before the second instance discharge of the battery 1000, current $I_2$ denotes the initial current level before the third instance discharge of the battery 1000, current $I_{peak1}$ denotes the peak current level of the first instance discharge of the battery 1000, current $I_{peak2}$ denotes the peak current level of the second instance discharge of the battery 1000, and current $I_{peak3}$ denotes the peak current level of the third instance discharge of the battery 1000.

FIG. 3 and FIG. 4 shows a possible aspect of test data related to three instances of quick discharge of the battery 1000 per second. Voltage $V_0$ is higher than voltage $V_1$ and voltage $V_2$. Voltage $V_{peak1}$, voltage $V_{peak2}$ and voltage $V_{peak3}$ are the lowest voltage levels of the three instances of discharge, respectively. Current $I_{peak1}$, current $I_{peak2}$ and current $I_{peak3}$ are the largest current levels of the three instances of discharge, respectively. However, the continuous voltage data D1 and the continuous current data D2 vary with the actual situation of the measured battery (such as battery capacity, battery remaining power level, battery temperature, and ambient temperature).

Referring to FIG. 2, the evaluation index calculating module 20 calculates an evaluation index in accordance with the continuous voltage data D1 and the continuous current data D2. In this embodiment, the evaluation index is restricted to maximum discharge impedance level index; hence, in this embodiment, there is one and only one evaluation index.

In this embodiment, the evaluation index calculating module 20 comprises a peak level indicating unit 21 and an impedance level calculating unit 22. The peak level indicating unit 21 indicates three peak voltage levels (i.e., voltage $V_{peak1}$, voltage $V_{peak2}$ and voltage $V_{peak3}$ shown in FIG. 3) from the continuous voltage data D1. Furthermore, the peak level indicating unit 21 indicates three peak current levels (i.e., current $I_{peak1}$, current $I_{peak2}$ and current $I_{peak3}$ shown in FIG. 4) from the continuous current data D2.

The impedance level calculating unit 22 divides the peak voltage levels by the peak current levels to calculate three peak impedance levels R1, R2, R3, respectively, wherein $R1=|V_0-V_{peak1}|/|I_{peak1}-I_0|$, $R2=|V_1-V_{peak2}|/|I_{peak2}-I_1|$, $R3=|V_2-V_{peak3}|/|I_{peak3}-I_2|$, thereby using the equation R=V/I to calculate the three peak impedance levels R1, R2, R3 which the three peak voltage levels and three peak current levels correspond to. The peak impedance levels R1, R2, R3 are known as the maximum discharge impedance level index.

In this embodiment, the evaluation index is restrictive to the maximum discharge impedance level index, and the maximum discharge impedance level index is obtained by the operation of the peak level indicating unit 21 and the impedance level calculating unit 22; hence, in this embodiment, the evaluation index calculating module 20 comprises the peak level indicating unit 21 and the impedance level calculating unit 22, but the way of obtaining the maximum discharge impedance level index is not limited thereto. In a variant embodiment, the peak level indicating unit 21 and the impedance level calculating unit 22 are optional. In another variant embodiment, the evaluation index does not include the maximum discharge impedance level index.

The evaluation result yielding module 30 compares the evaluation index with stored past data to yield an evaluation result about a health state of the battery 1000. The past data includes experimental data about different health states of the battery.

For example, as shown in FIG. 5, the past data falls into four categories of experimental data, namely a 100% remaining power level, an 85% remaining power level, a 45% remaining power level, and a 15% remaining power level. R1, R2 and R3 measure 0.017μΩ, 0.016μΩ, and 0.015μΩ, respectively, at the 100% remaining power level. R1, R2 and R3 measure 0.027μΩ, 0.026μΩ, and 0.025μΩ, respectively, at the 85% remaining power level. R1, R2 and R3 measure 0.050μΩ, 0.049μΩ, and 0.048μΩ, respectively, at the 45% remaining power level. R1, R2 and R3 measure 0.057μΩ, 0.056μΩ, and 0.055μΩ, respectively, at the 15% remaining power level.

If the peak impedance levels R1, R2, R3 of the battery 1000 in this embodiment are calculated to be 0.027μΩ, 0.026μΩ, and 0.025μΩ, respectively, then it is confirmed that the battery 1000 has a remaining power level of 85%, thereby yielding the evaluation result of a remaining power level of 85%.

The odds are that a battery with a 100% remaining power level is a new battery which has never been used. By contrast, batteries with an 85% remaining power level and a 45% remaining power level are old batteries which have ever been used on a number of occasions. A battery with a 15% remaining power level is defined as a useless battery which is simply not worth recycling and thus must be discarded immediately.

Another embodiment is illustrated by the other experimental data which falls into five categories of experimental data, namely remaining power levels of 100%, 80%, 60%, 40% and 20%, or even falls into 10 or 20 categories of experimental data. Persons skilled in the art understand that the accuracy of the evaluation result increases with experimental data used as past data, albeit at the cost of storage space.

If the calculated peak impedance levels R1, R2, R3 of a battery do not match any experimental data (for example, the calculated peak impedance levels R1, R2, R3 are 0.035μΩ, 0.036μΩ, and 0.037μΩ, respectively, but a database which stores past data does not contain any experimental data which matches the peak impedance levels R1, R2, R3), then a similar evaluation result can be obtained by interpolation.

Figure 6:
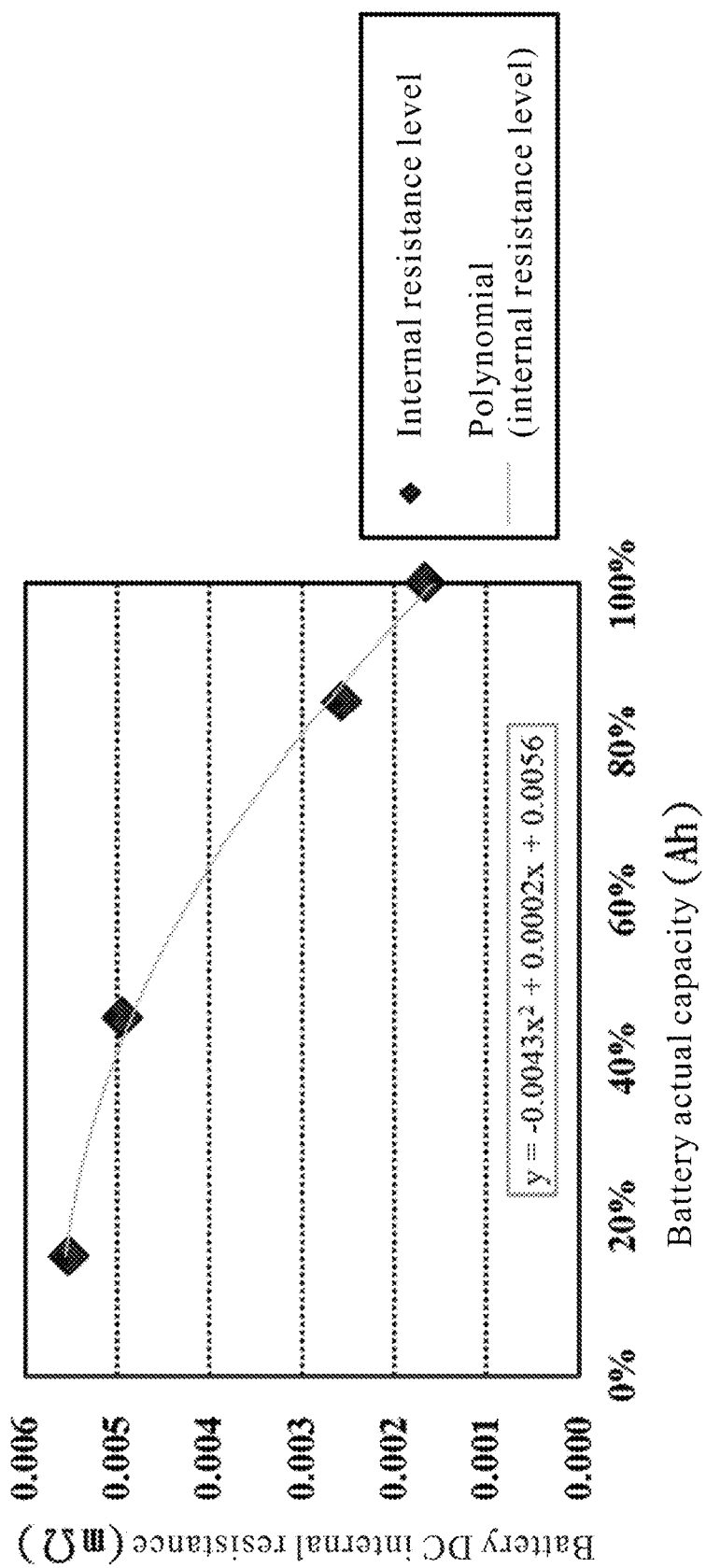
FIG. 6 is a graph of battery DC internal resistance against battery actual capacity, for obtaining an evaluation result by a relation.

Referring to FIG. 6, when the database which stores past data has accumulated a specific amount of experimental data, a relation between the battery remaining capacity and the impedance level can be calculated. If the database is searched, only to find no experimental data which matches the peak impedance levels R1, R2, R3, a similar evaluation result can be obtained by, for example, the relation.

Unlike conventional test devices, the battery health state evaluation device 100 of the present invention yields the evaluation result in one second; hence, the present invention is effective in performing a test quickly.

The most important technical feature that distinguishes the battery health state evaluation device 100 according to this embodiment of the present invention from conventional test devices is as follows: during the operation of the battery health state evaluation device 100, the battery 1000 need not be removed from the object 2000. Hence, the battery health state evaluation device 100 of the present invention performs health state evaluation while the battery 1000 is in use. Therefore, unlike conventional test devices, the battery health state evaluation device 100 of the present invention is simple and convenient.

Figure 7A:
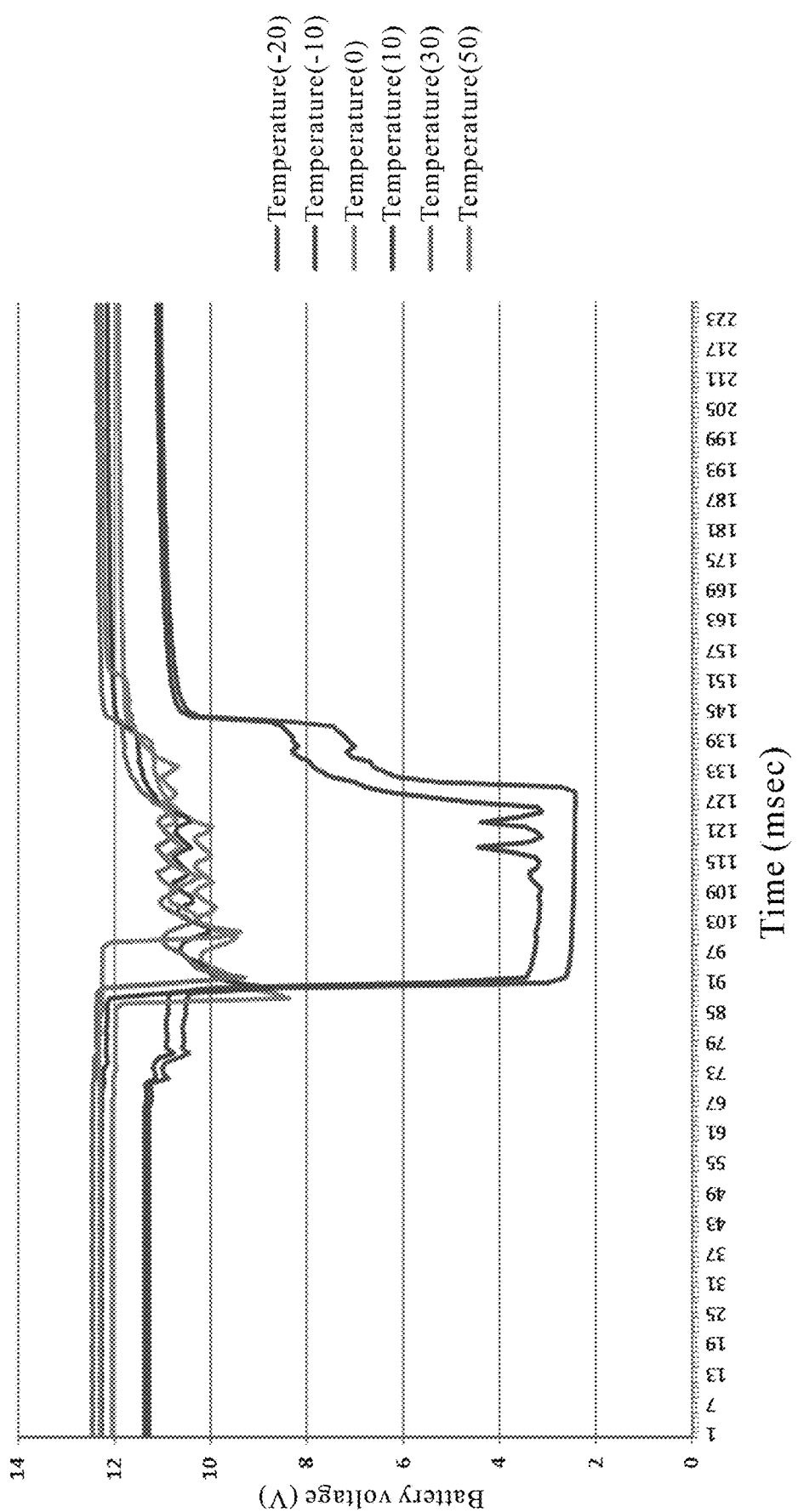
FIG. 7A is a graph of voltage or current against time of the same battery at different battery temperatures.
Figure 7B:
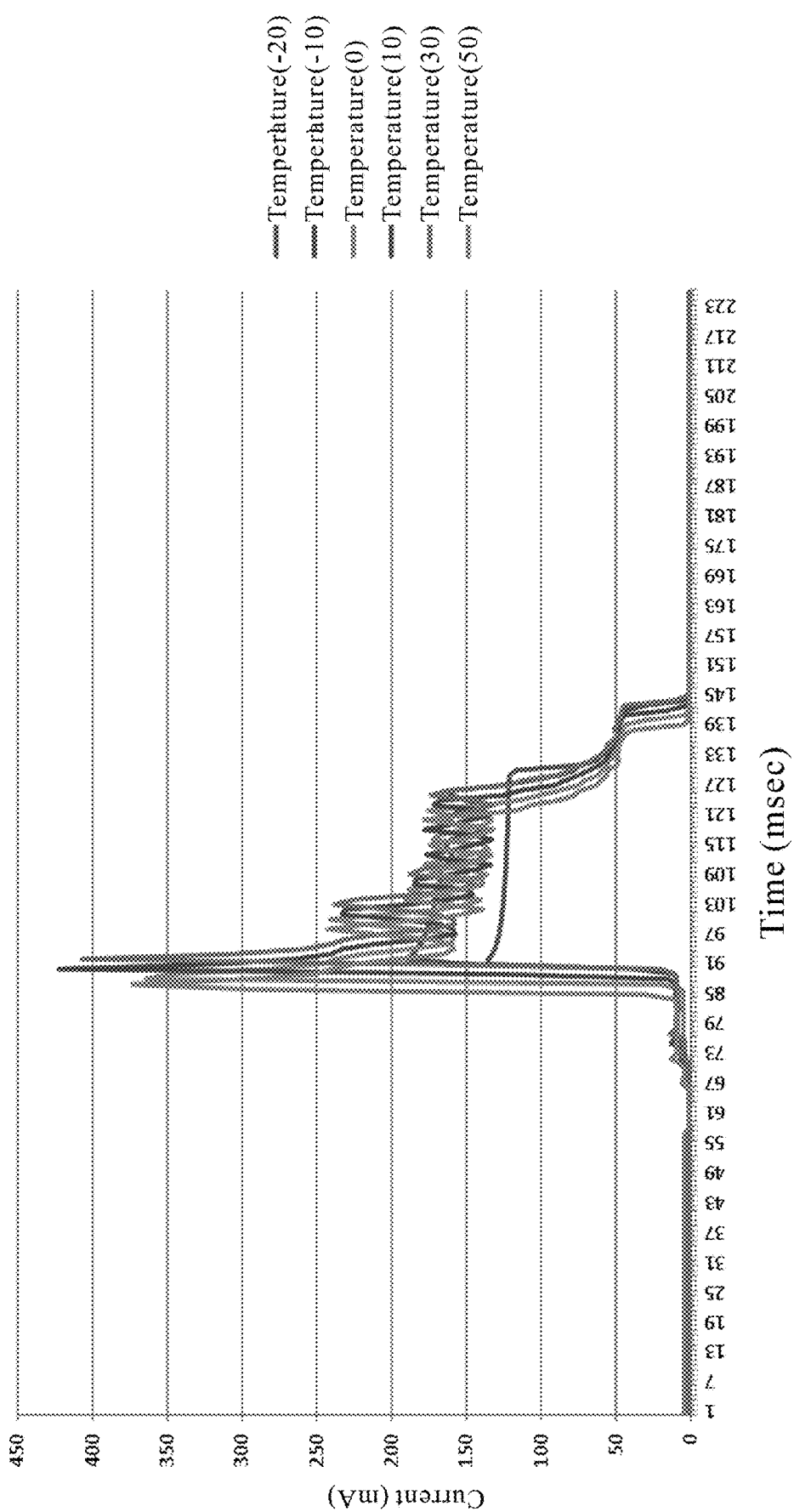
FIG. 7B is a graph of voltage or current against time of the same battery at different battery temperatures.
Figure 7C:
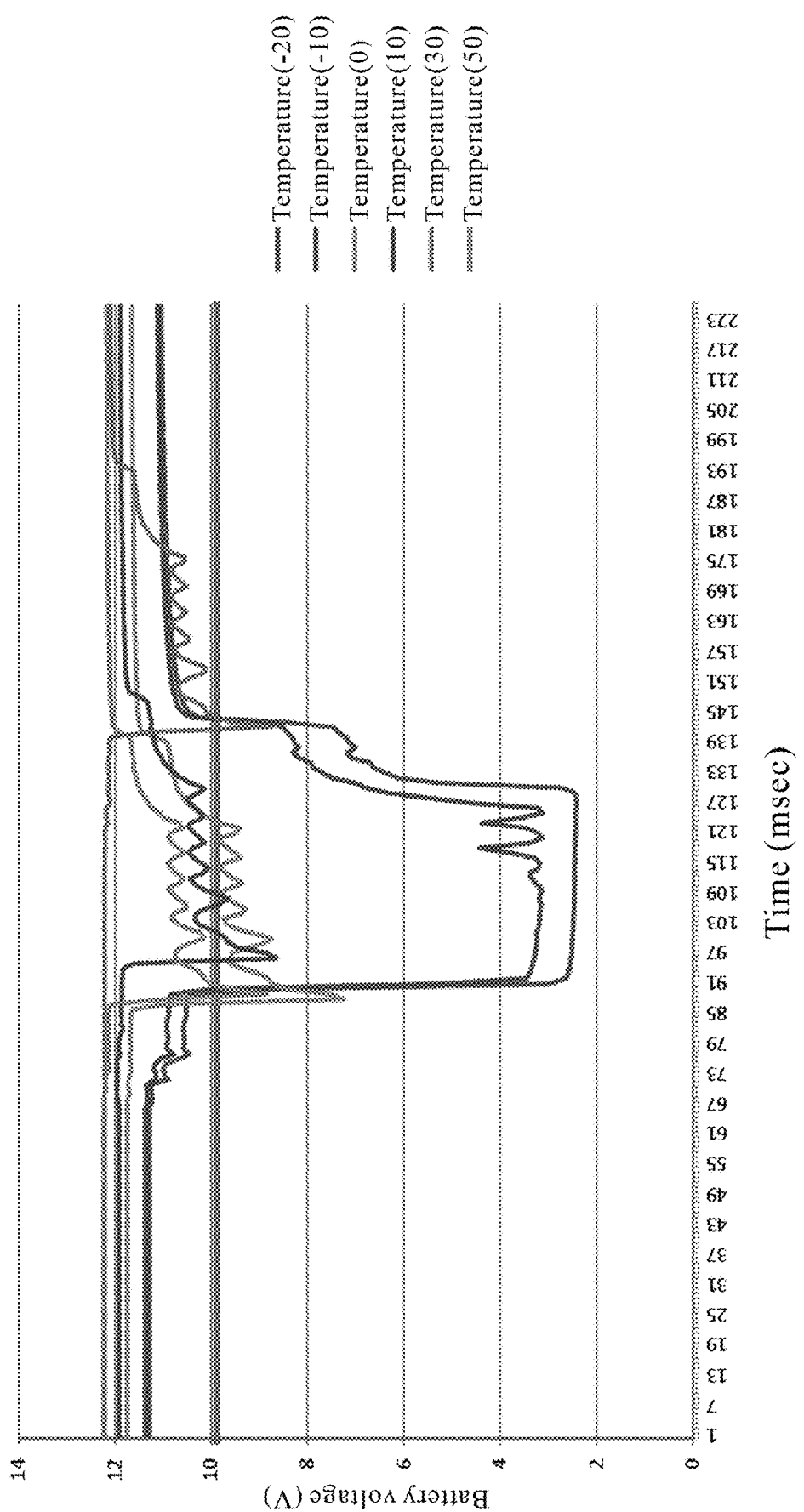
FIG. 7C is a graph of voltage or current against time of the same battery at different battery temperatures.
Figure 7D:
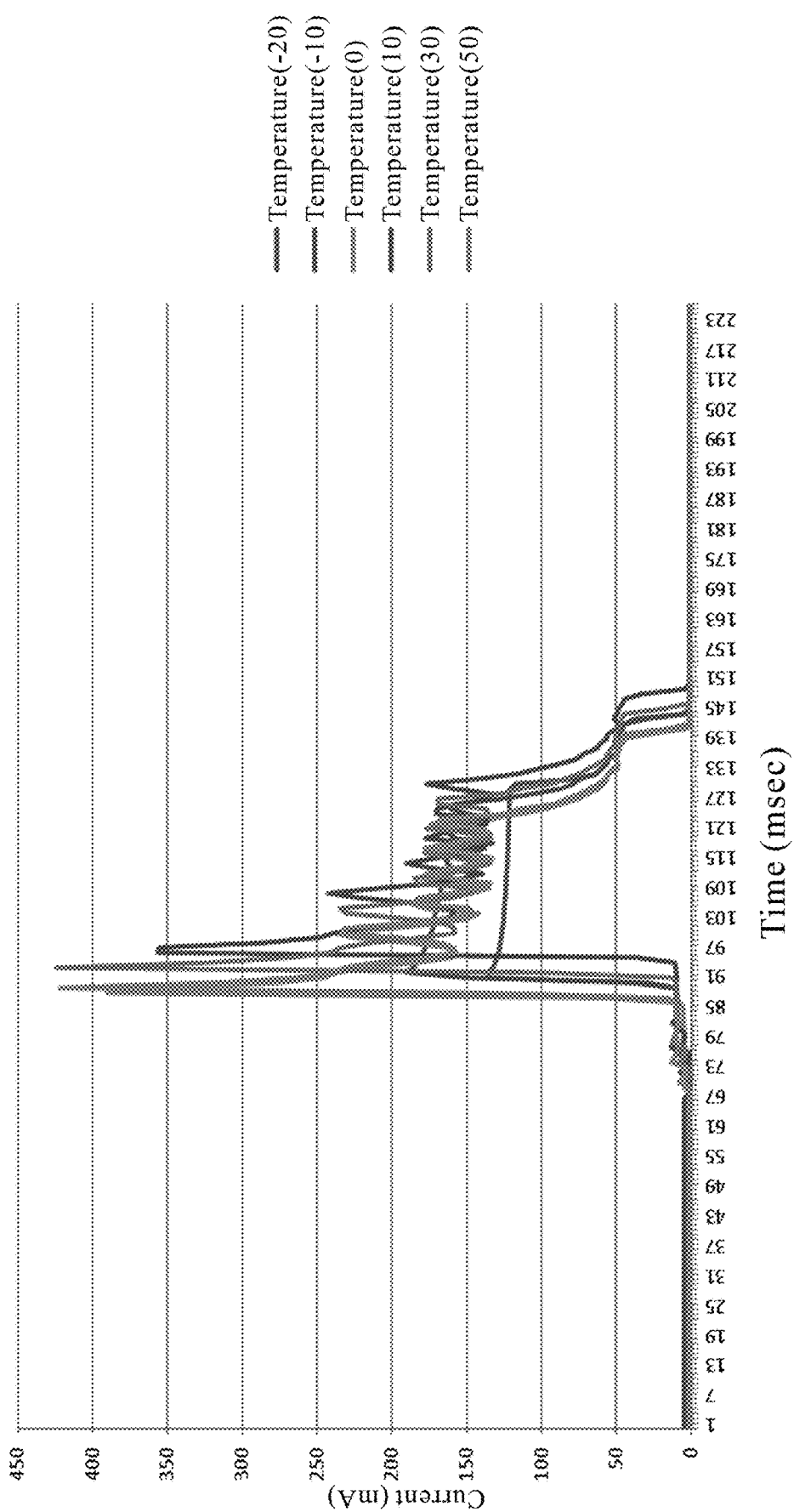
FIG. 7D is a graph of voltage or current against time of the same battery at different battery temperatures.
Figure 7E:
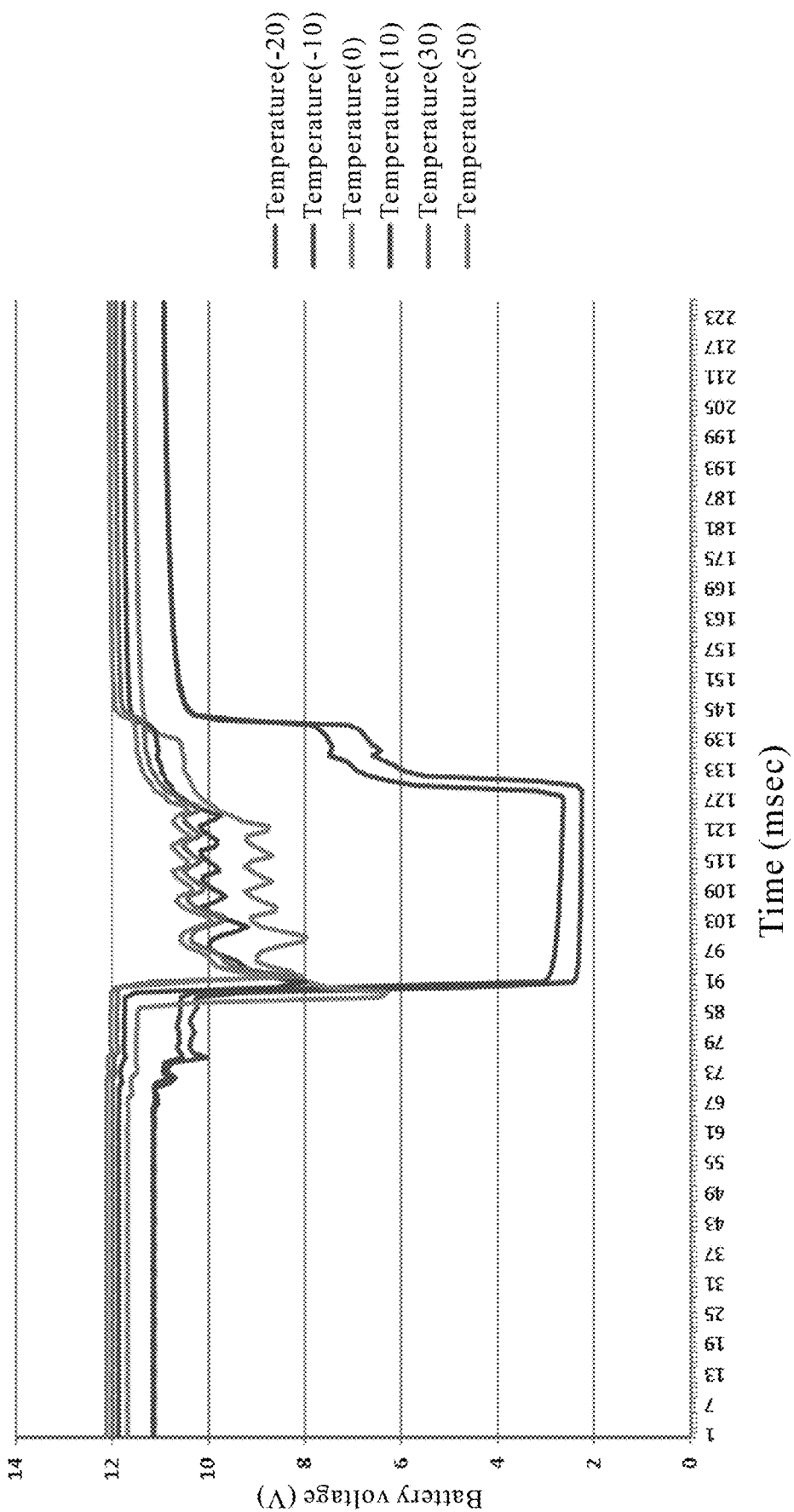
FIG. 7E is a graph of voltage or current against time of the same battery at different battery temperatures.
Figure 7F:
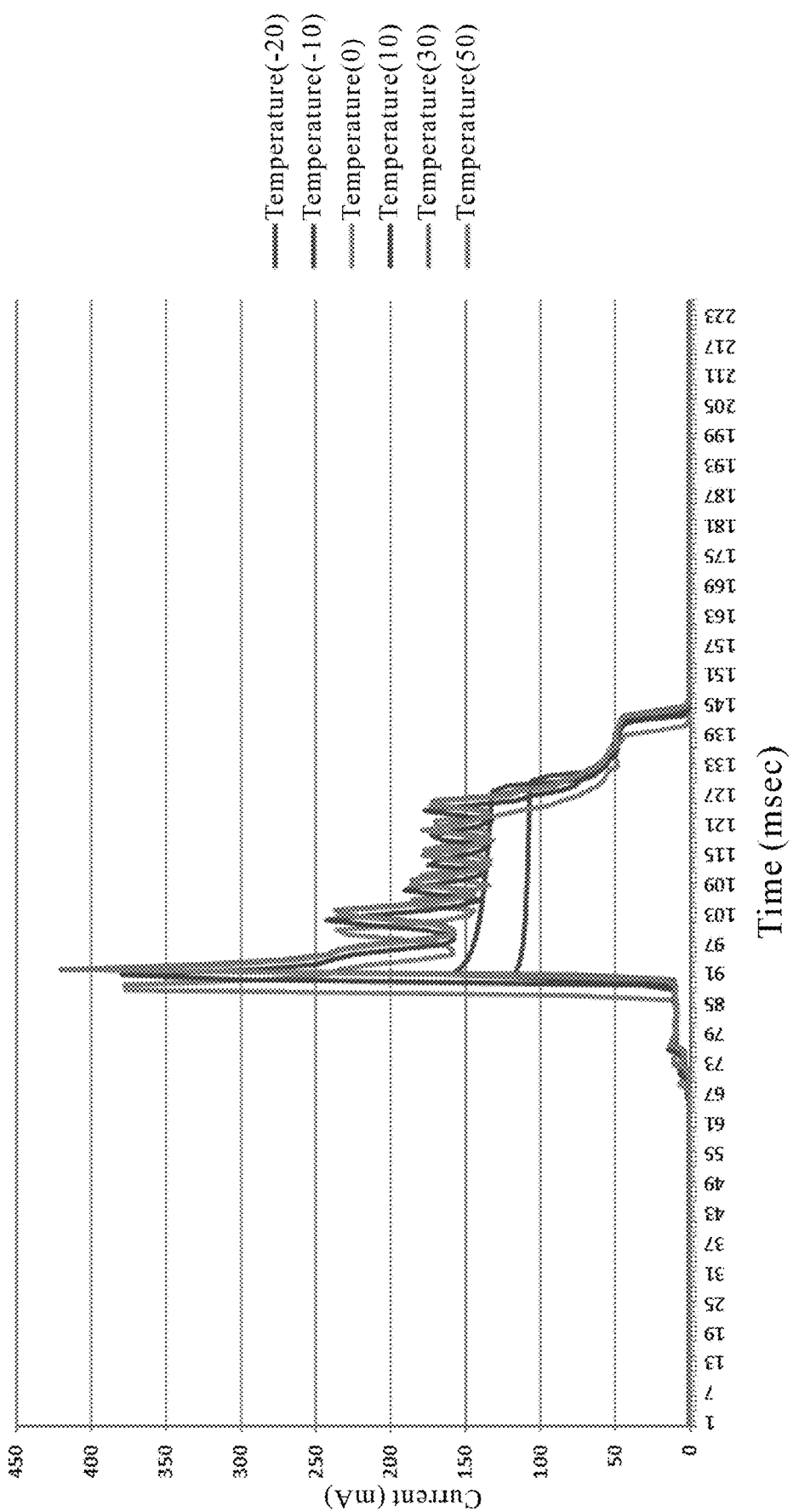
FIG. 7F is a graph of voltage or current against time of the same battery at different battery temperatures.

Please refer to FIG. 7A through FIG. 7F. FIG. 7A is a graph of voltage against time of the battery with a 100% remaining power level at different battery temperatures. FIG. 7B is a graph of current against time of the battery with a 100% remaining power level at different battery temperatures. FIG. 7C is a graph of voltage against time of the battery with an 80% remaining power level at different battery temperatures. FIG. 7D is a graph of current against time of the battery with an 80% remaining power level at different battery temperatures. FIG. 7E is a graph of voltage against time of the battery with a 60% remaining power level at different battery temperatures. FIG. 7F is a graph of current against time of the battery with a 60% remaining power level at different battery temperatures.

Referring to FIG. 7A through FIG. 7F, there is a large difference in the same battery at different battery temperatures between the voltage against time relationship and the current against time relationship; hence, the evaluation indexes and the evaluation result must be corrected in accordance with the battery temperatures measured.

Referring to FIG. 7A through FIG. 7F, the battery temperatures are −20° C., −10° C., 0° C., 10° C., 30° C., and 50° C. The graphs shown in FIG. 7A through FIG. 7F are regarded as part of the past data to serve as reference for use in correcting an evaluation result of the battery 1000.

The aforesaid temperature compensation is conducive to the health state evaluation performed by the battery health state evaluation device 100 and especially conducive to the health state evaluation of a battery in use. It is because, when compared with a battery not in use, a battery in use is more susceptible to the surroundings in terms of battery temperature and thus has a larger variation in battery temperature, thereby leading to severe distortion of the evaluation result. The distortion is prevented by the aforesaid correction technique.

Figure 8:
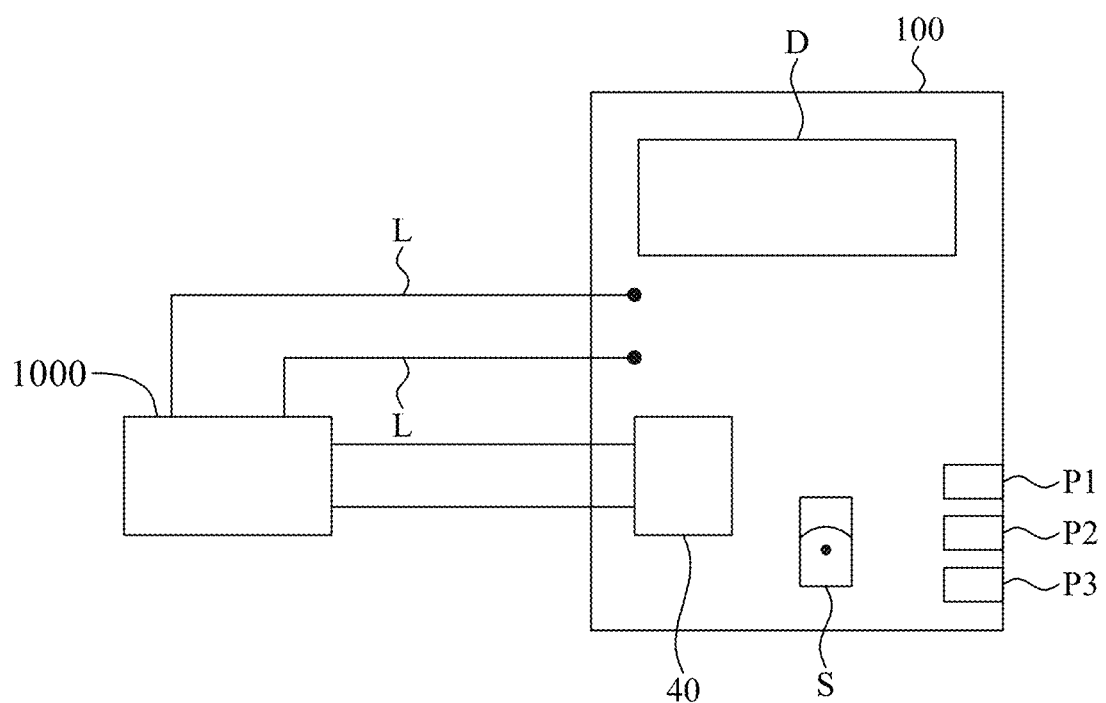
FIG. 8 is a schematic view of the battery health state evaluation device according to another embodiment of the present invention.

Referring to FIG. 8, in another embodiment, the battery health state evaluation device 100 comprises a programmable loader 40. The programmable loader 40 is an engine or any other component adapted to simulate a function of an engine and thereby start the battery 1000. In this embodiment, the battery 1000 need not be placed inside a battery chamber of the object 2000. Since a battery not in use still has to be started in order for the battery to discharge, the embodiment provides one of the ways to start a battery not in use, so as to facilitate the health state evaluation of a battery not in use.

In another embodiment of the battery health state evaluation device of the present invention, the evaluation indexes comprise a remaining capacity prediction index, a maximum charge temperature variation rate index, a maximum charge voltage variation rate index, a maximum voltage recovery variation rate index, a maximum discharge current level index, a maximum discharge impedance level index, and/or a pulse discharge impedance level convergence tendency index. The evaluation result comprises a remaining capacity level, a failure risk level, and/or a remaining lifespan level. The definitions of the evaluation indexes and the evaluation result are further explained in detail when the battery health state evaluation method is described below.

Figure 9:
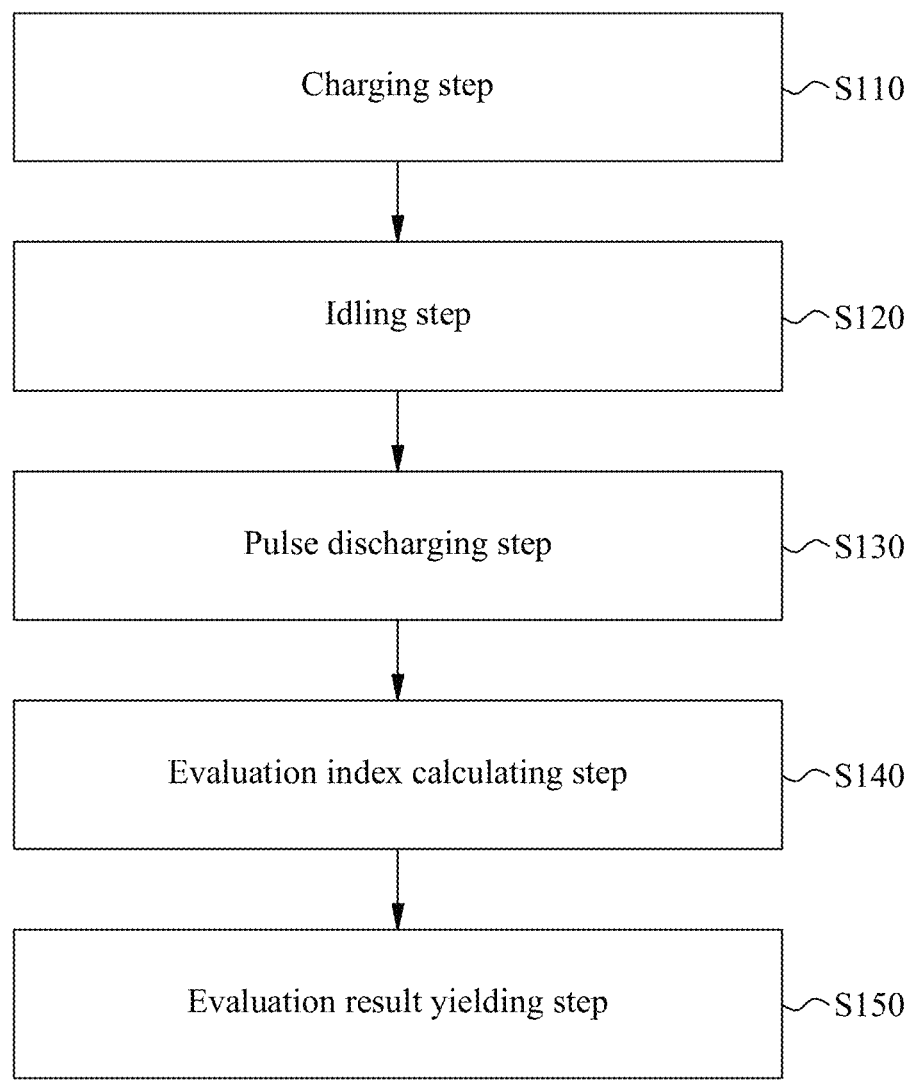
FIG. 9 is a flowchart of a battery health state evaluation method according to an embodiment of the present invention.

Referring to FIG. 9, it is a flowchart of a battery health state evaluation method S100 according to an embodiment of the present invention. The method S100 is for evaluating a health state of a battery. The method S100 comprises a charging step S110, an idling step S120, a pulse discharging step S130, an evaluation index calculating step S140, and an evaluation result yielding step S150.

The charging step S110 entails charging the battery with a fixed current. The charging step lasts for a first time period, wherein the first time period is around 300 seconds, and the fixed current is 1 C. The idling step S120 involves not only stopping the charging of the battery but also idling the battery. The idling step S120 lasts for a second time period, wherein the second time period is around 60 seconds.

The pulse discharging step S130 entails starting the battery so that the battery undergoes pulse discharge thrice consecutively in one second. The peak current level $I_{peak2}$ of the second instance pulse discharge is 90% the current level $I_{peak1}$ of the first instance pulse discharge. The current level $I_{peak3}$ of the third instance pulse discharge is 80% the current level $I_{peak1}$ of the first instance pulse discharge.

The reason why the pulse discharging step S130 requires that pulse discharge occur thrice consecutively within a short time period is as follows: the process approximates to the actual use of a battery, because, in various application systems, a large current must be supplied to start a power generator within a short time period after a battery has started, and thus data retrieved in the process can serve as an important basis of evaluation of the health state of the battery. The application systems include a fuel-powered vehicle system, an oil-fired power generation system, and an uninterruptible power supply (UPS). If the present health state of the battery deteriorates or ages markedly, the battery's capability of providing an instantaneous current level required for quick release and start will be inevitably compromised, and the failure risk associated with difficulty in a start will increase.

The retrieval of pulse discharge-related data is described below. Immediately after a power generator has started, a starting battery is charged or float charged (i.e., trickle charged) by the power generator which it has started, and thus a starting battery is usually charged to the fullest capacity and saturated voltage level (i.e., a remaining power level SoC 95%~100%) in order to quickly release a starting instantaneous current. Due to intrinsic characteristics of conventional electrochemical batteries, a fully charged starting battery has the lowest DC internal impedance and thus has the optimal capability to provide a large current for instantaneous power supply. A reduction in the remaining power level SoC is accompanied by an increase in DC impedance and a reduction in the capability to effectuate large-current instantaneous discharge to the detriment of starting a power generator.

Figure 10:
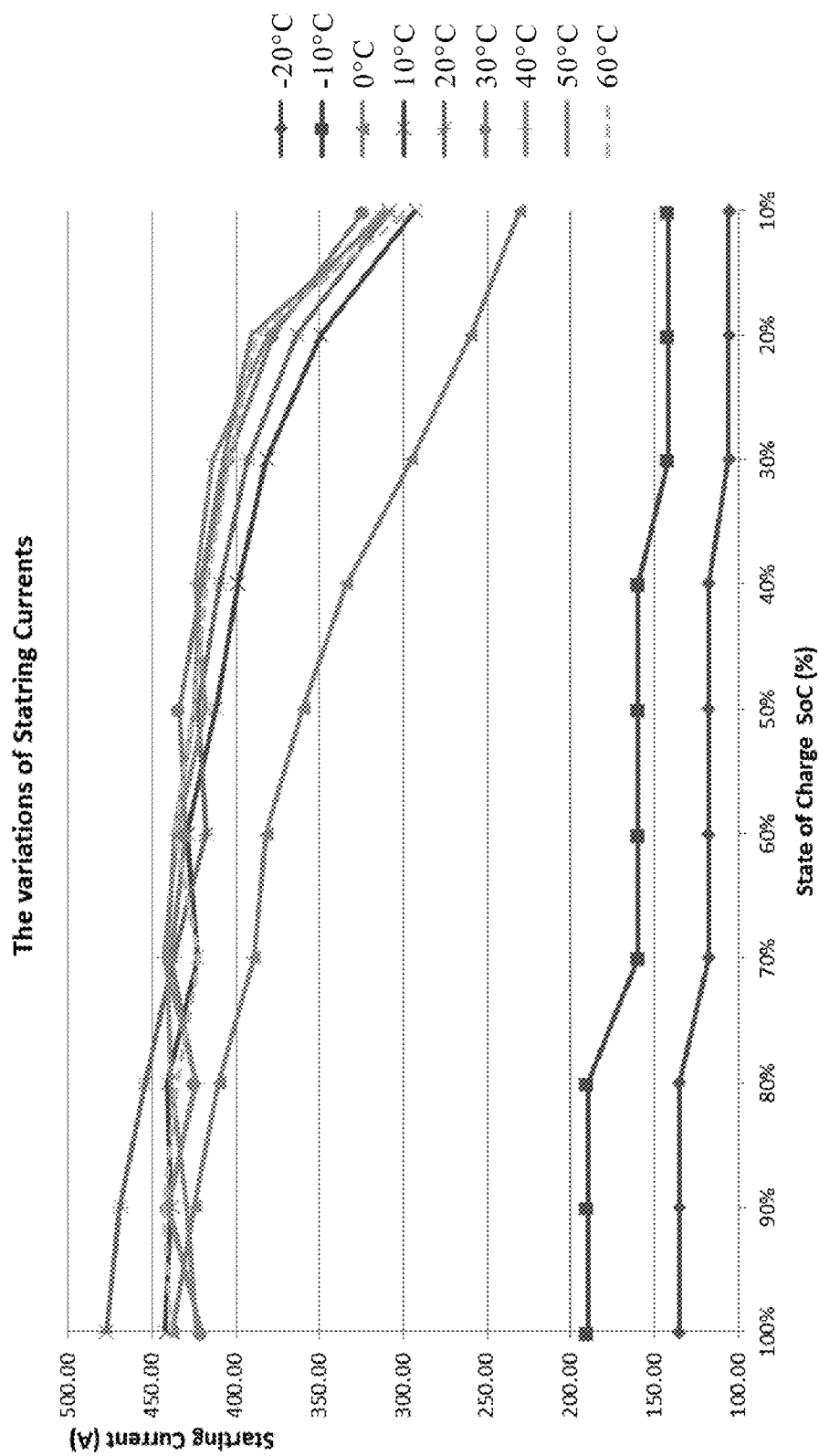
FIG. 10 are graphs of starting current against remaining power level for a starting battery according to an embodiment of the present invention.

Referring to FIG. 10, the maximum instantaneous discharge current level required for a starting battery (manufactured by GS Battery Taiwan Co., Ltd., model number: TEV12500) at different ambient temperatures decreases with the remaining power level SoC. A starting battery's capability to effectuate large-current instantaneous discharge decreases with temperature markedly.

The starting battery described in some embodiments herein applies to Toyota Corona Premio 2.0 which requires a minimum 350 A starting current for starting its engine.

Referring to FIG. 9, the evaluation index calculating step S140 entails retrieving a continuous voltage data D1 and a continuous current data D2 during the charging process, the idling process and the pulse discharge process and calculating a plurality of evaluation indexes with the continuous voltage data D1 and the continuous current data D2, wherein the evaluation indexes relate to the health state of the battery.

The evaluation indexes comprise the remaining capacity prediction index, the maximum charge temperature variation rate index, the maximum charge voltage variation rate index, the maximum voltage recovery variation rate index, the maximum discharge current level index, the maximum discharge impedance level index, and/or the pulse discharge impedance level convergence tendency index.

The remaining capacity prediction index, the maximum charge temperature variation rate index, and the maximum charge voltage variation rate index are obtained in the charging step S110. The maximum voltage recovery variation rate index is obtained in the idling step S120. The maximum discharge current level index, the maximum discharge impedance level index, and the pulse discharge impedance level convergence tendency index are obtained in the pulse discharging step S130.

Figure 11:
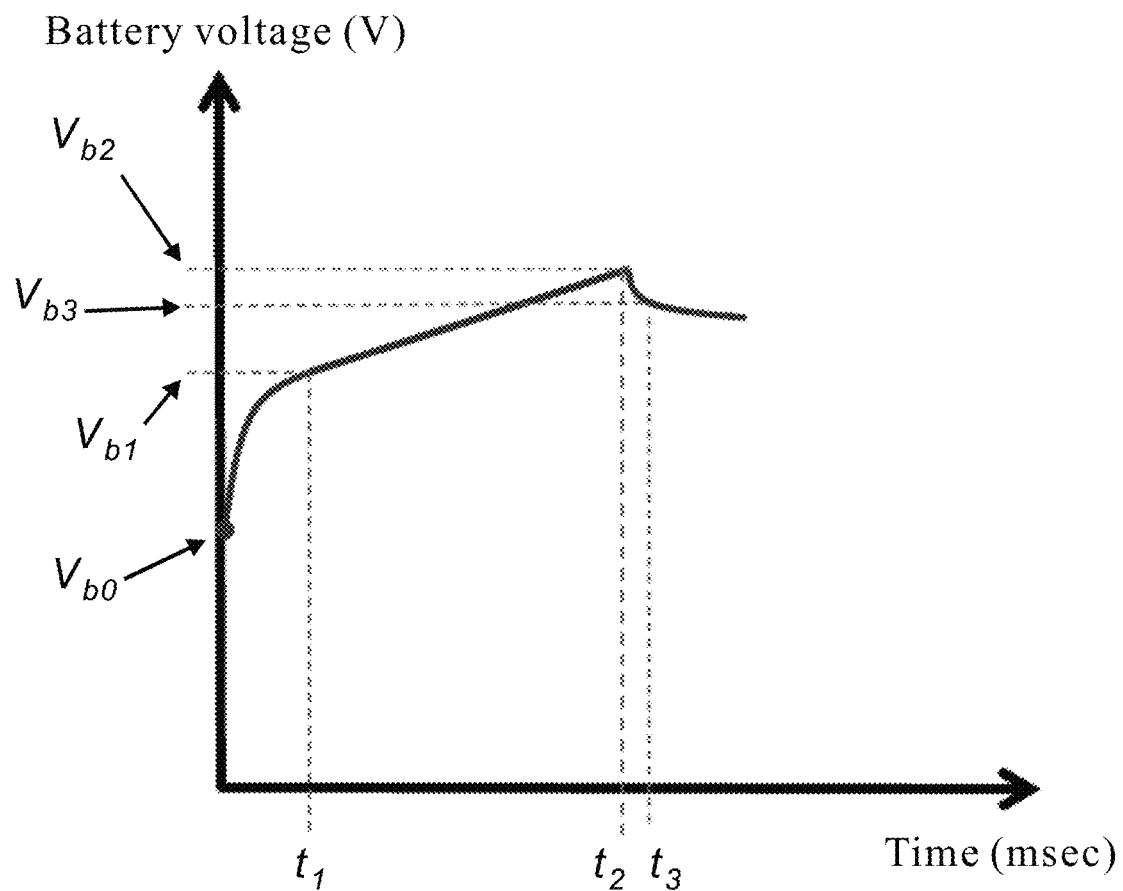
FIG. 11 is a graph of battery voltage against time in the charging step and the idling step according to an embodiment of the present invention.
Figure 12:
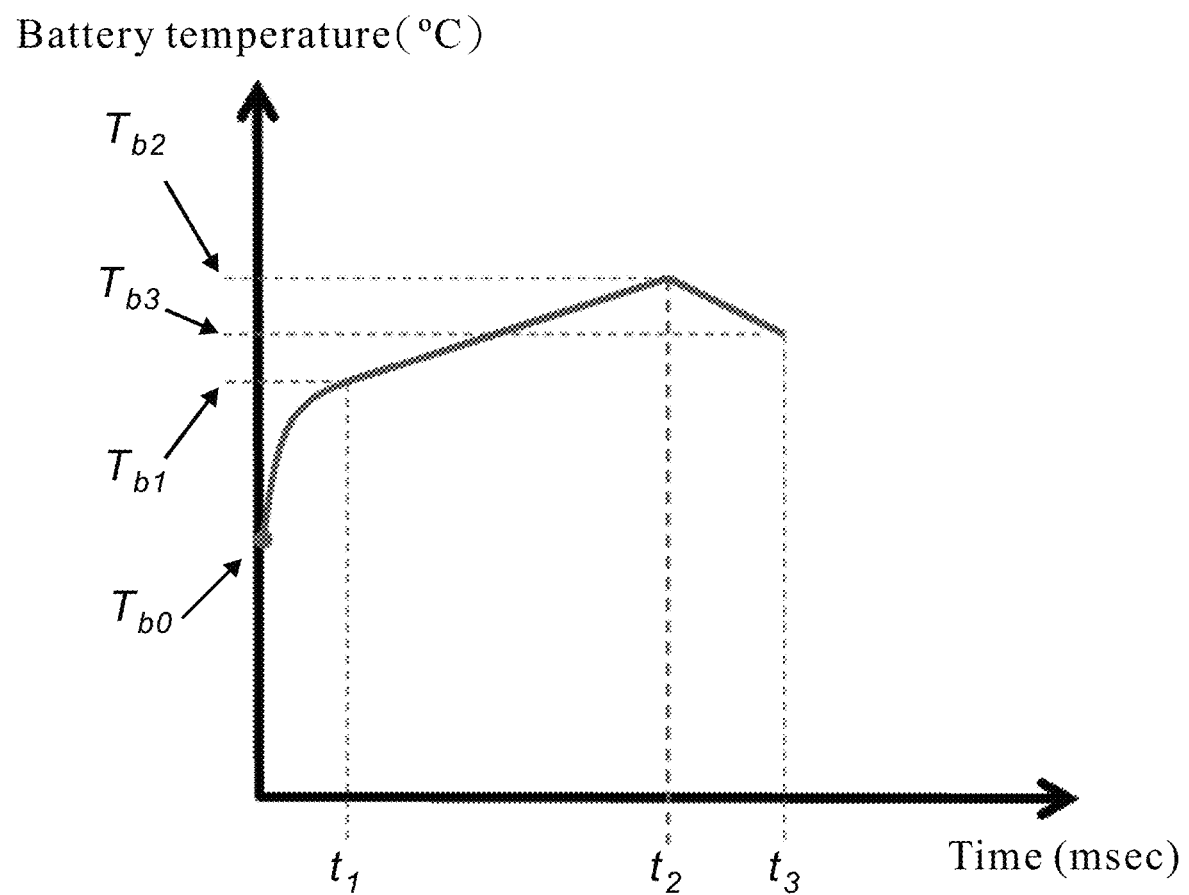
FIG. 12 is a graph of battery temperature against time in the charging step and the idling step according to an embodiment of the present invention.

Referring to FIG. 11 and FIG. 12, FIG. 11 is a graph of battery voltage against time in the charging step S110 and the idling step S120 according to an embodiment of the present invention, and FIG. 12 is a graph of battery temperature against time in the charging step S110 and the idling step S120 according to an embodiment of the present invention.

Referring to FIG. 11 and FIG. 12, the charging step S110 begins at time t1 and ends at time t2, whereas the idling step S120 begins at time t2 and ends at time t3, wherein voltage $V_{b0}$ denotes the battery's initial voltage level, voltage $V_{b1}$ denotes the inflection voltage level at which the maximum rising rate of voltage occurs, voltage $V_{b2}$ denotes the voltage level at the beginning of the idling process, voltage $V_{b3}$ denotes the voltage level at the end of the idling process, temperature $T_{b0}$ denotes the battery's initial temperature level, temperature $T_{b1}$ denotes the inflection temperature level at which the maximum rising rate of temperature occurs, temperature $T_{b2}$ denotes temperature level at the beginning of the idling process, and temperature $T_{b3}$ denotes the temperature level at the end of the idling process.

The remaining capacity prediction index is calculated with the expression $(V_{upper}-V_{lower})/\overline{V}*1$ C, where voltage $V_{upper}$ denotes the battery's upper limit voltage, and voltage $V_{lower}$ denotes the battery's lower limit voltage, and the voltage variation rate $\overline{V}_{lower}$ equals $|V_{b2}-V_{b1}|/|t2-t1|$, where 1 C denotes power level.

The maximum charge temperature variation rate index is calculated with the expression $(T_{b1}-T_{b0})/t1$. The maximum charge voltage variation rate index is calculated with the expression $(V_{b1}-V_{b0})/t1$. The maximum voltage recovery variation rate index is calculated with the expression $|V_{b3}-V_{b2}|/|t3-t2|$.

Referring to FIG. 3 and FIG. 4, the maximum discharge current level index is calculated with the expression $I_{peak1}-I_0$. The way of calculating the maximum discharge impedance level index is not described herein for the sake of brevity. The pulse discharge impedance level convergence tendency index is calculated by comparing R1, R2 and R3; if R1>R2>R3, then it means that the electrochemical reaction taking place inside the battery is fine, and that the battery functions well.

The evaluation result yielding step S150 involves evaluating the battery's health state in accordance with the indexes and yielding an evaluation result. The evaluation result comprises the remaining capacity level, the failure risk level, and/or the remaining lifespan level. The remaining capacity level means an estimated level of the battery remaining capacity. The failure risk level means the probability of a failure of the battery. A failure risk level of 95% refers to the situation where the battery has a 95% chance of a start failure. The remaining lifespan level means the remaining time for the battery to be usable. A remaining lifespan level of 180 days indicates that the battery is going to become unusable in 180 days.

The evaluation result informs, quickly and generally, a user of the battery's health state on a preliminary basis so that the user can decide whether to conduct a specific health state test on the battery. Although in some special situations there is a significant error, say a 3%~5% error, between the evaluation result and the reality, the present invention is effective in performing a test quickly. Accordingly, the present invention is practical.

If the evaluation indexes include the aforesaid seven indexes, then the evaluation result comprises the aforesaid remaining capacity level, failure risk level, and remaining lifespan level. The remaining capacity level is obtained solely in accordance with the remaining capacity prediction index. The failure risk level is obtained in accordance with the maximum charge temperature variation rate index, maximum discharge current level index, maximum discharge impedance level index, and pulse discharge impedance level convergence tendency index. The remaining lifespan level is obtained in accordance with the remaining capacity prediction index, maximum charge voltage variation rate index, maximum voltage recovery variation rate index, and pulse discharge impedance level convergence tendency index.

Therefore, the remaining capacity level, failure risk level, and remaining lifespan level are obtained in accordance with at least one of the evaluation indexes. The process of obtaining the remaining capacity level, failure risk level, and remaining lifespan level requires the application of some specific computation rules, such as interpolation method, and curve-fitting method. The interpolation method can be a multi-dimension interpolation method, such as polynomial method, artificial neural network method, fussy logic method, genetic algorithm method, stimulation annealing method, ANFIS method, or a combination thereof, so as to design a prediction model for calculating the remaining capacity level, the failure risk level, and the remaining lifespan level.

The evaluation result yielding step S150 further comprises a temperature compensation step S151 for performing numerical correction on the evaluation indexes and sensed ambient temperature in accordance with past data. The temperature compensation function is described in the embodiment depicted by FIG. 7A~FIG. 7F and thus is not described again for the sake of brevity.

The battery health state evaluation device and method of the present invention treat each evaluation result as past data. After multiple batteries have been tested, the battery health state evaluation device and method of the present invention are highly accurate.

Furthermore, the battery health state evaluation device and method of the present invention apply the evaluation indexes to a calculation process and feature a temperature adjustment function, thereby rendering the evaluation result highly precise.

In conclusion, the battery health state evaluation device of the present invention obtains one or more evaluation indexes associated with a battery's health state and builds a calculation module based on the evaluation indexes. Furthermore, an evaluation result of the battery's health state is obtained with the evaluation result yielding module. The battery health state evaluation method of the present invention comprises an evaluation index calculating step for obtaining one or more evaluation indexes associated with the battery's health state, and an evaluation result yielding step for obtaining an evaluation result of the battery's health state.

The present invention is disclosed above by preferred embodiments. However, persons skilled in the art should understand that the preferred embodiments are illustrative of the present invention only, but should not be interpreted as restrictive of the scope of the present invention. Hence, all equivalent variations and replacements made to the aforesaid embodiments should fall within the scope of the present invention. Accordingly, the legal protection for the present invention should be defined by the appended claims.

The claims are as follows:

1. A battery health state evaluation method, for evaluating a health state of a battery, the battery health state evaluation method comprising:
   a charging step for charging the battery with a fixed current;
   an idling step for stopping the charging of the battery but idling the battery;
   a pulse discharging step for starting the battery to cause the battery to undergo pulse discharge thrice consecutively;
   an evaluation index calculating step for retrieving a continuous voltage data and a continuous current data in the charging process, the idling process, and the pulse discharge process and applying the retrieved continuous voltage data and continuous current data to calculation of a plurality of evaluation indexes associated with the health state of the battery; and an evaluation result yielding step for evaluating the health state of the battery with the indexes and yielding an evaluation result, wherein in the pulse discharging step, a peak current level of a second instance pulse discharge is less than a peak current level of a first instance pulse discharge, and a peak current level of a third instance pulse discharge is less than the peak current level of the second instance pulse discharge so as to simulate actual use of the battery to start a power generator within a time period shortly after the battery has started.

2. The battery health state evaluation method of claim 1, wherein the charging step lasts for a first time period, and the idling step lasts for a second time period.

3. The battery health state evaluation method of claim 1, wherein the evaluation indexes comprise a remaining capacity prediction index, a maximum charge temperature variation rate index, a maximum charge voltage variation rate index, a maximum voltage recovery variation rate index, a maximum discharge current level index, a maximum discharge impedance level index, and a pulse discharge impedance level convergence tendency index.

4. The battery health state evaluation method of claim 1, wherein, in the pulse discharging step, the peak current level of the second instance pulse discharge is 90% the peak current level of the first instance pulse discharge, and the peak current level of the third instance pulse discharge is 80% the peak current level of the first instance pulse discharge.

5. The battery health state evaluation method of claim 1, wherein the pulse discharging step lasts for less than one second.

6. The battery health state evaluation method of claim 1, wherein the evaluation result comprises a remaining capacity level, and the evaluation indexes comprise a remaining capacity prediction index.

7. The battery health state evaluation method of claim 1, wherein the evaluation result comprises a failure risk level, and the evaluation indexes comprise a maximum charge temperature variation rate index, a maximum discharge current level index, a maximum discharge impedance level index, and a pulse discharge impedance level convergence tendency index.

8. The battery health state evaluation method of claim 1, wherein the evaluation result comprises a remaining lifespan level, and the evaluation indexes comprise a remaining capacity prediction index, a maximum charge voltage variation rate index, a maximum voltage recovery variation rate index, and a pulse discharge impedance level convergence tendency index.

9. The battery health state evaluation method of claim 1, wherein the evaluation result yielding step further comprises a temperature compensation step for performing numerical correction on the evaluation indexes and a sensed ambient temperature in accordance with past data.

\* \* \* \* \*